(12) United States Patent
Yamagishi

(10) Patent No.: US 6,372,040 B1
(45) Date of Patent: Apr. 16, 2002

(54) SINGLE CRYSTAL GROWTH APPARATUS AND SINGLE CRYSTAL GROWTH METHOD

(75) Inventor: Hirotoshi Yamagishi, Annaka (JP)

(73) Assignee: Super Silicon Crystal Research Institute Corp., Gunma (JP)

( * ) Notice: Subject to any disclaimer, the term of this patent is extended or adjusted under 35 U.S.C. 154(b) by 0 days.

(21) Appl. No.: 09/647,848
(22) PCT Filed: Nov. 24, 1999
(86) PCT No.: PCT/JP99/06529
§ 371 Date: Oct. 6, 2000
§ 102(e) Date: Oct. 6, 2000
(87) PCT Pub. No.: WO00/50672
PCT Pub. Date: Aug. 31, 2000
(51) Int. Cl.[7] .................................................. G30B 15/20
(52) U.S. Cl. ........................... 117/14; 117/13; 117/15; 117/35; 117/208; 117/218; 117/932
(58) Field of Search .............................. 117/13, 14, 15, 117/218, 932, 208, 35

(56) References Cited

U.S. PATENT DOCUMENTS

| | | | |
|---|---|---|---|
| 5,126,113 A | * 6/1992 | Yamagishi et al. | 117/218 |
| 5,879,449 A | * 3/1999 | Urano et al. | 117/35 |
| 5,951,759 A | * 9/1999 | Inagaki et al. | 117/208 |
| 6,022,411 A | * 2/2000 | Kuramoto | 117/218 |
| 6,053,975 A | * 4/2000 | Iida et al. | 117/218 |
| 6,139,633 A | * 10/2000 | Nishiura | 117/218 |
| 6,299,684 B1 | * 10/2001 | Schulmann | 117/208 |

* cited by examiner

Primary Examiner—Robert Kunemund
(74) Attorney, Agent, or Firm—Connolly Bove Lodge & Hutz LLP

(57) ABSTRACT

In an arrangement to grip lower part of a portion with larger diameter of single crystal formed by CZ method, the present invention provides an apparatus and a method for growing and pulling up the single crystal without causing deformation or rupture and under dislocation-free and stable condition even when the portion with larger diameter is at high temperature and when the single crystal rod has heavy weight of about 400 kg and large diameter. Under the condition that a material having Shore hardness of not less than 70, Vickers hardness of not more than 100, and tensile strength of not less than 400 MPa is used as a contact member which is used on a portion of gripping members in contact with lower part of the portion with larger diameter, and when minimum diameter of a constricted portion under the portion with larger diameter is set to 12 mm or more, temperature (° C.) is controlled to satisfy the relation:

$$W \le -(4/3)T + 1270$$

where W (kg) is the weight of the single crystal engaged and held, and T (° C.) is temperature of gripping part of the portion with larger diameter, and the temperature T is between 500° C. and 800° C. so that the portion with larger diameter of the single crystal can be gripped under the condition of high temperature and heavy weight.

4 Claims, 2 Drawing Sheets

SINGLE CRYSTAL GROWTH APPARATUS AND SINGLE CRYSTAL GROWTH METHOD

TECHNICAL FIELD

The present invention relates to a single crystal growing apparatus and a single crystal growing method for manufacturing dislocation-free single crystal of silicon by the pulling CZ (Czochralski) method.

BACKGROUND ART

In general, in a single crystal growing apparatus or a single crystal pulling apparatus based on the pulling CZ method, the pressure in a space within a highly pressure-proof airtight chamber is reduced to about 10 Torr and fresh argon (Ar) gas is introduced into it At the same time, polycrystal in a quart crucible disposed in the lower portion of the chamber is heated and melted, and a seed crystal is immersed into the surface of this melt. While the seed crystal and the quartz crucible are rotated and moved up and down, the seed crystal is pulled up. Then, a single crystal rod (the socalled ingot) is grown, which comprises an upper cone portion in conical shape with its upper end protruding under the seed crystal, a body portion in cylindrical shape, and a lower cone portion in conical shape with its lower end protruding.

As a method for growing a single crystal as described above, Dash method is known in the art According to this method, with the purpose of eliminating dislocation (to turn to dislocation-free) which occurs to the seed crystal due to thermal shock when the seed crystal is immersed into the surface of the melt, pulling rate is relatively increased after the seed crystal has been immersed into the surface of the melt. As a result, a neck portion with diameter smaller than the diameter of the seed crystal, e.g. diameter of 3 to 4 mm, is formed, and the pulling of the upper cone portion as described above is started.

To solve the problem that it is not possible to pull up the single crystal of large diameter and heavy weight (150 to 200 kg or more), a method is proposed, for example, in Japanese Patent Publication 5-65477. According to this method, a neck portion with smaller diameter is formed by Dash method. Then, pulling rate is relatively decreased to form a portion with larger diameter. Next, pulling rate is relatively increased to form a portion with smaller diameter. As a result, "a spherical portion with larger diameter" is formed. By gripping the portion with larger diameter using grippers, the single crystal of large diameter and heavy weight is pulled up. Conventional type apparatuses for gripping the portion with larger diameter are described, for example, in Japanese Patent Publications 7-103000 and 7-515.

There are other conventional examples such as a method to grip the body portion without forming the "portion with larger diameter" is disclosed, for example, in Japanese Patent Publications Laid-Open 5-270974 or 7-172981. Also, there is a method for forming "an annular portion with larger diameter" having a diameter larger than the diameter of the body portion between the upper cone portion and the body portion and for gripping this "annular portion with larger diameter" instead of forming the "spherical portion with larger diameter" as described above, and this is proposed in Japanese Patent Publications Laid-Open 63-252991 or 5-270975. In these conventional methods, gripping members with tops, which can be opened or closed, are used to grip the lower end of the portion with larger diameter of the single crystal. Such gripping members must have a certain strength under high temperature condition, and metallic member made of molybdenum is used, for example.

Japanese Patent Publication Laid-Open 10-95697 discloses a method for engaging and holding the portion with larger diameter formed for holding single crystal rod under 550° C. or lower in the single crystal growing apparatus. This method is based on the experimental data that silicon neck may be ruptured from the seed reducing portion and slip dislocation may occur in the single crystal under the temperature higher the above temperature.

In case silicon single crystal of heavy weight is grown, the temperature of 550° C. is too low to engage and hold the silicon single crystal. However, the single crystal can be engaged and held only at the temperature of 550° C. or lower. If the growing crystal is gripped and stress is applied under the temperature higher than the above value, plastic deformation may take place on the crystal, and dislocation may occur in the growing crystal. Further, when such dislocation occurs, strength of the single crystal is decreased, and there may arise possibility of rupture in the subsequent process of single crystal growth.

On the other hand, with rapid development and progress to produce and use devices of highly integrated design, there are strong demands to increase the diameter of single crystal to be grown in the single crystal growing apparatus. In case single crystal with larger diameter is grown, the crystal may have heavy weight even when the single crystal is pulled up slightly. In this respect, it is desirable to engage and hold the single crystal in a stage as early as possible, i.e. when the portion with larger diameter is at high temperature.

To solve the problems of dealing with a single crystal of heavy weight and of achieving engagement and holding of the portion with larger diameter at high temperature, it is an object of the present invention to provide a method and an apparatus, by which it is possible to grow a single crystal rod of heavy weight and large diameter in dislocation-free and stable condition and to pull up the single crystal without damaging the crystal habit line of the single crystal and without causing deformation and interlaminar peeling due to the applied load. It is accomplished by finding the relation between the temperature of the portion with larger diameter and weight of the single crystal rod as required for engagement and holding of the single crystal and by finding that engagement and holding of the portion with larger diameter can be achieved at high temperature.

DISCLOSURE OF THE INVENTION

To attain the above object, the present invention provides a single crystal growing apparatus for pulling up single crystal, by which single crystal can be engaged and held by controlling temperature T (° C.) in such manner as to satisfy the relabon:

$$W \leq -(4/3)T + 1270$$

where T is temperature of the gripping portion to grip the portion with larger diameter, and W (kg) is weight of single crystal engaged with and held by the single crystal gripping members, under the condition that a contact member made of a material having Shore hardness of not less than 70, Vickers hardness of not more than 100, and tensile strength of not less than 400 MPa is used on a portion of the single crystal gripping members, which is brought into contact with the lower part of the portion with larger diameter, and minimum diameter of a constricted portion under the portion with larger diameter is set to 12 mm or more.

Specifically, the present invention provides a single crystal growing apparatus, which comprises a chamber with a quartz crucible disposed therein, a quartz crucible for melting a melt to be used as raw material for a single crystal, a seed crystal lift mechanism for moving a seed crystal up and down above the quartz crucible, and single crystal gripping members arranged movably in upward and downward directions in the chamber, whereby the seed crystal lift mechanism is used to immerse the seed crystal into a melt in the quartz crucible and to pull up the seed crystal, and to form a single crystal neck portion, a portion with larger diameter of single crystal, and a constricted portion under the portion with larger diameter, and a single crystal rod, and the single crystal gripping members are used to pull up the single crystal by gripping the portion with larger diameter from below and to pull up the single crystal after the portion with larger diameter of the single crystal has been formed; and there is provided means for controlling temperature T (° C.) to satisfy the relation:

$$W \leq -(4/3)T+1270$$

where T is temperature of the gripping portion to grip the portion with larger diameter, W (kg) is weight of single crystal engaged with and held by the single crystal gripping members, and T is between 500° C. and 800° C. under the condition that:

a contact member made of a material having Shore hardness of not less than 70, Vickers hardness of not more than 100, and tensile strength of not less than 400 MPa is used on a portion of the single crystal gripping members, which is brought into contact with the lower part of the portion with larger diameter, and minimum diameter of a constricted portion under the portion with larger diameter is set to 12 mm or more.

BEST MODE FOR CARRYING OUT THE INVENTION

Figure 2:
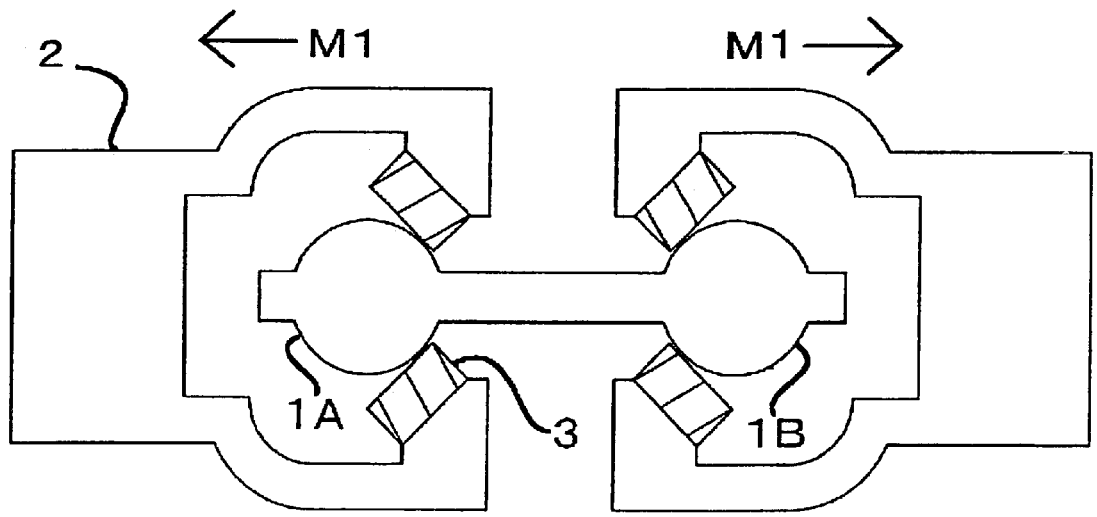
FIG. 2 is a schematical drawing to show an embodiment of a tensile test to demonstrate the effect of the present invention.
Figure 3:
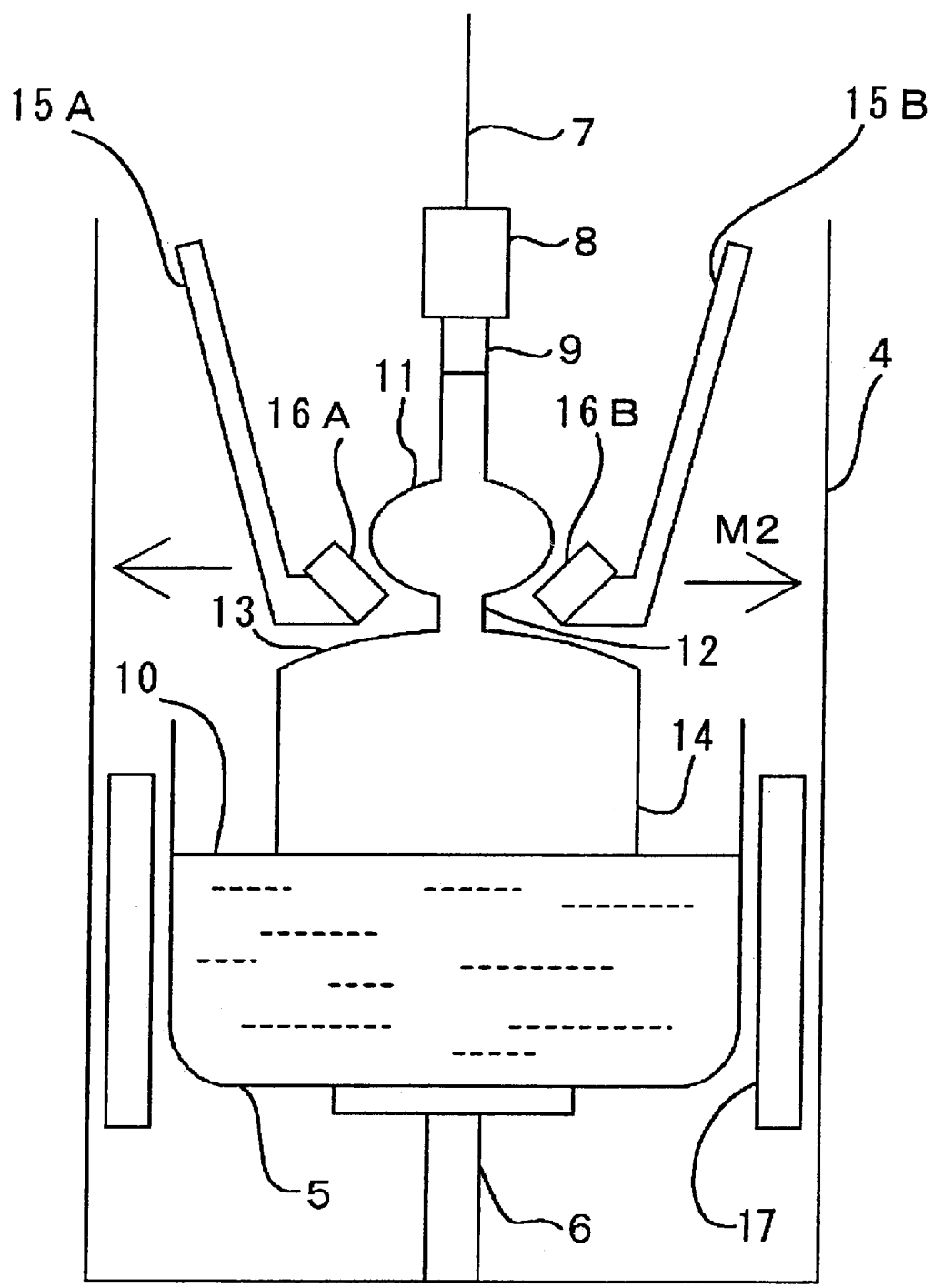
FIG. 3 is a partial cross-sectional view for schematically showing an embodiment of a single crystal growing apparatus according to the present invention.

Description will be given below on an embodiment of the present invention referring to the drawings. FIG. 2 is a schematical drawing to show an embodiment of a tensile test in the present invention. This tensile test is to test engaging and holding strength of a portion with larger diameter in a single crystal growing apparatus shown in FIG. 3. In FIG. 3, a quartz crucible 5 is rotatably mounted by means of a pedestal 6 in a vacuum chamber 4, which also serves as a casing of the single crystal growing apparatus. Above the quartz crucible 5, a pull shaft (wire) 7 is mounted on a lift mechanism (not shown) so that it can be moved up and down. At the top of the pull shaft 7, a seed crystal holder 8 is mounted, and a seed crystal 9 is mounted on the seed crystal holder 8. A heater 17 is mounted to endose the quartz crucible 5. FIG. 3 shows such stages of process that the seed crystal 9 is immersed into a crystal melt 10 in the quartz crucible 5, and it is then pulled up to form a Dash's neck. Further, a portion with larger diameter 11 is formed, and after shaping a constricted portion 12, an upper cone portion 13 and a body portion 14 are formed.

Tips of two gripping members 15A and 15B can be inserted under the portion with larger diameter 11. The tips of the two gripping members 15A and 15B can be moved in directions perpendicular to the pulling direction (in directions perpendicular to the pull shaft 7 in FIG. 3) as shown by an arrow M2. The two gripping members 15A and 15B are synchronously rotated with the seed crystal 9 by a rotating and lifting mechanism (not shown) and can be moved up or down by a mechanism, which is independent from or partially common with the lift mechanism of the pull shaft 7. The gripping members are used to grip the portion with larger diameter 11 from under the portion with larger diameter 11. On a part of each of the gripping members 15A and 15B to be in contact with the portion with larger diameter 11, contact members 16A and 16B are arranged respectively.

FIG. 2 shows a segment of the apparatus near the portion with larger diameter 11 of the single crystal growing apparatus of FIG. 3. As a test material, a silicon single crystal which has portions with larger diameter 1A and 1B near the two ends is disposed, and this is engaged with a tensile test hand 2. Then, it is pulled in two directions as shown by arrows M1 in FIG. 2, and the test is performed. Contact members 3 can be attached to the tensile test hand 2, and these are brought into contact with the portions with larger diameter and a load is applied. In this tensile test as shown here, a material having Shore hardness of not less than 70, Vickers hardness of not more than 100, and tensile strength of not less than 400 MPa is used as the contact member. As a concrete example of the material, carbon fiber reinforced carbon composite material (C-CVD CC material) is used. Minimum diameter of the constricted portion under the portion with larger diameter is set to 12 mm or more.

In the apparatus shown in FIG. 2, under constant temperature condition, silicon bicones 1A and 1B are pulled from both sides by the tensile test hand 2, and tensile force is measured. As the result of measurement, maximum withstand load to the changes of force is obtained. When the load is increased to a certain value or more, interlaminar peeling occurs inside the contact member 3, and the load is decreased. In this respect, there is a peak value in the load.

Figure 1:
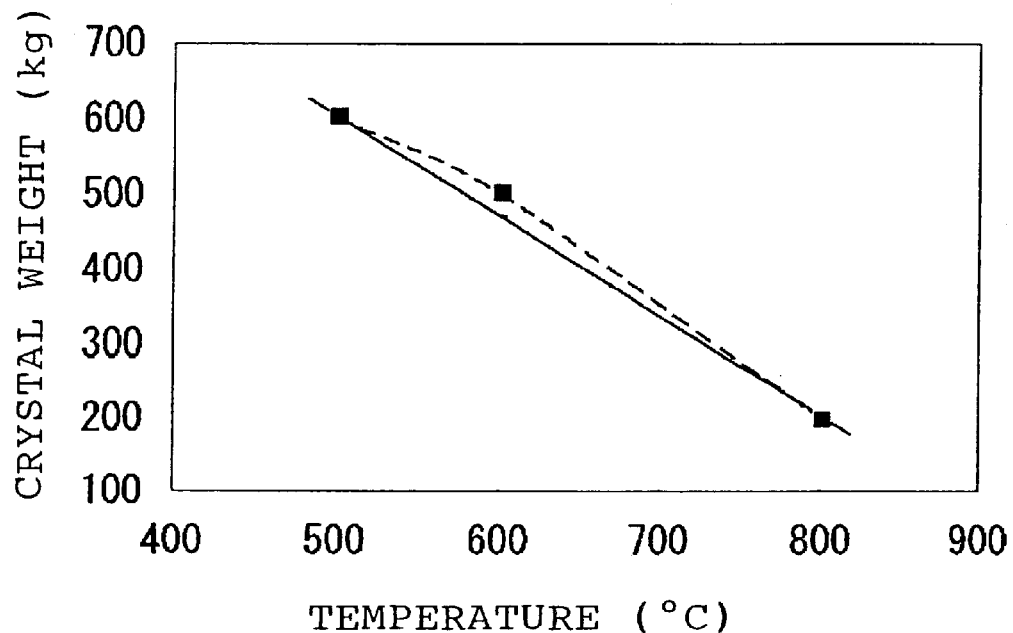
FIG. 1 is a graph obtained by plotting the maximum withstand load and temperature of a silicon bicone as measured by a tensile test shown in FIG. 2.

FIG. 1 is a graph showing the result of measurement of maximum withstand load (the peak value of the load as described above) in the tensile test of silicon bicone under the condition of 500° C.–800° C. In FIG. 1, the axis of abscissa represents temperature of silicon bicone, and the axis of ordinate shows maximum withstand load. When temperature of silicon bicone is 500° C., 600° C. and 800° C. respectively, maximum withstand load is 600 kg, 500 kg and 200 kg respectively.

These results reveal that a gripping member with a contact member having Shore hardness of not less than 70, Vickers hardness of not more than 100, and tensile strength of not less than 400 MPa has sufficient strength even when the portion with larger diameter is at high temperature and the single crystal under pulling has heavy weight.

In Japanese Patent Publication Laid-Open 10-95697, it is described that engagement and holding of the portion with larger diameter is maintained when the portion with larger diameter is at the temperature of not more than 550° C. As it is evident from the above experiment, even when the portion with larger diameter is at temperature of 550° C. or more, it is possible to grow a single crystal of heavy weight and large diameter by stable and dislocation-free pulling operation without causing plastic deformation or rupture.

In the above embodiment, the gripping member is designed in form of an arm and it comprises two sub-members which can be opened or closed in directions perpendicular to the pulling direction, while the present invention is not limited to the gripping member of such structure. Specifically, even when the gripping member or the engagement holding mechanism is structurally different any type of member may be used so far as it is designed to engage with and hold the portion with larger diameter of single crystal from below and the contact member is made of a material which has Shore hardness of not less than 70, Vickers hardness of not more than 100, and tensile strength of not less than 400 MPa.

INDUSTRIAL APPLICABILITY

As described above, in a single crystal growing apparatus according to the present invention, the temperature T (° C.) is controlled such manner as to satisfy the relation given by the equation:

$$W \leq -(4/3)T + 1270$$

where T is temperature of the gripping portion to grip the portion with larger diameter, W (kg) is weight of single crystal engaged with and held by the single crystal gripping members, and T is between 500° C. and 800° C. under the condition that:

a contact member made of a material having Shore hardness of not less than 70, Vickers hardness of not more than 100, and tensile strength of not less than 400 MPa is used on a portion of the single crystal gripping members, which is brought into contact with the lower part of the portion with larger diameter, and minimum diameter of a constricted portion under the portion with larger diameter is set to 12 mm or more. As a result, it is possible to engage and hold the single crystal, and the portion with larger diameter of single crystal can be gripped even under the condition of high temperature and heavy weight In this respect, a single crystal rod with weight as heavy as 400 kg can be grown and pulled up in stable and dislocation-free manner.

Further, under the above condition, if carbon fiber reinforced carbon composite material (CCVD CC material) is used as the contact member, it is possible to achieve the purpose in more reliable and effective manner.

What is claimed is:

1. A single crystal growing apparatus, comprising a chamber with a quartz crucible disposed therein, a quartz crucible for melting a melt to be used as raw material for a single crystal, a seed crystal lift mechanism for moving a seed crystal up and down above the quartz crucible, and single crystal gripping members arranged movably in upward and downward directions in the chamber, whereby said seed crystal lift mechanism is used to immerse the seed crystal into a melt in the quartz crucible and to pull up the seed crystal, and to form a single crystal neck portion, a portion with larger diameter of single crystal, and a constricted portion under the portion with larger diameter, and a single crystal rod, and said single crystal gripping members are used to pull up the single crystal by gripping the portion with larger diameter from below and to pull up the single crystal after the portion with larger diameter of the single crystal has been formed; and there is provided means for controlling temperature T (° C.) to satisfy the relation:

$$W \leq -(4/3)T + 1270$$

where T is temperature of the gripping portion to grip the portion with larger diameter, W (kg) is weight of single crystal engaged with and held by the single crystal gripping members, and T is between 500° C. and 800° C. under the condition that:

a contact member made of a material having Shore hardness of not less than 70, Vickers hardness of not more than 100, and tensile strength of not less than 400 MPa is used on a portion of the single crystal gripping members, which is brought into contact with the lower part of the portion with larger diameter, and minimum diameter of a constricted portion under the portion with larger diameter is set to 12 mm or more.

2. The single crystal growing apparatus according to claim 1, wherein there is provided means to use a material with a thermally decomposed carbon film formed on surface of a carbon fiber reinforced carbon composite material as a material to be used as said contact member.

3. A single crystal growing method, using a single crystal growing apparatus, which comprises a chamber with a quartz crucible disposed therein, a quartz crucible for melting a melt to be used as raw material for a single crystal, a seed crystal lift mechanism for moving a seed crystal up and down above the quartz crucible, and single crystal gripping members arranged movably in upward and downward directions in the chamber, whereby said seed crystal lift mechanism is used to immerse the seed crystal into a melt in the quartz crucible and to pull up the seed crystal, and to form a single crystal neck portion, a portion with larger diameter of single crystal, and a constricted portion under the portion with larger diameter, and a single crystal rod, and said single crystal gripping members are used to pull up the single crystal by gripping the portion with larger diameter from below and to pull up the single crystal after the portion with larger diameter of the single crystal has been formed; and there is provided means for controlling temperature T (° C.) to satisfy the relation:

$$W \leq -(4/3)T + 1270$$

where T is temperature of the gripping portion to grip the portion with larger diameter, W (kg) is weight of single crystal engaged with and held by the single crystal gripping members, and T is between 500° C. and 800° C. under the condition that:

a contact member made of a material having Shore hardness of not less than 70, Vickers hardness of not more than 100, and tensile strength of not less than 400 MPa is used on a portion of the single crystal gripping members, which is brought into contact with the lower part of the portion with larger diameter, and minimum diameter of a constricted portion under the portion with larger diameter is set to 12 mm or more.

4. The single crystal growing method according to claim 3, wherein a thermally decomposed carbon film is formed on surface of a carbon fiber reinforced carbon composite material and used as said contact member.

\* \* \* \* \*